United States Patent [19]

Moore

[11] 4,433,288
[45] Feb. 21, 1984

[54] METHOD AND APPARATUS FOR DETERMINING MINORITY CARRIER DIFFUSION LENGTH IN SEMICONDUCTORS

[75] Inventor: Arnold R. Moore, Princeton, N.J.
[73] Assignee: RCA Corporation, New York, N.Y.
[21] Appl. No.: 280,918
[22] Filed: Jul. 6, 1981
[51] Int. Cl.$^3$ .............................................. G01R 31/26
[52] U.S. Cl. ............................ 324/158 D; 324/158 R
[58] Field of Search ........... 324/158 D, 158 R, 158 T, 324/73 R

[56] References Cited

U.S. PATENT DOCUMENTS 4,051,437 9/1977 Lile et al. .............................. 324/158
4,333,051 6/1982 Goodman ........................ 324/158 R

OTHER PUBLICATIONS

A. M. Goodman, "A Method for the Measurement of Short Minority Carrier Diffusion Lengths in Semiconductors," *J. of Applied Physics*, vol. 32, No. 12, pp. 2550-2552, Dec. 1961.
J. N. Shive, "Properties, Physics and Design of Semiconductor Devices," Van Nostrand, N.Y., 1959, p. 337.
R. Williams, "Schottky Barriers at the Interface Between Amorphous Silicon and Electrolytes," *J. Applied Physics*, 50 (4 Apr. 1979), pp. 2848-2851.
W. M. Latimer, *Oxidation Potentials*, Prentice Hall, 1952, Table 84, pp. 340-345.

Primary Examiner—Ernest F. Karlsen
Attorney, Agent, or Firm—Birgit E. Morris; Donald S. Cohen; Joseph D. Lazar

[57] ABSTRACT

Method and apparatus are provided for determining the diffusion length of minority carriers in semiconductor material, particularly amorphous silicon, which has a significantly small minority carrier diffusion length using the constant magnitude surface-photovoltage (SPV) method. Steady or modulated illumination at several wavelengths provides the light excitation on the surface of the material to generate the SPV. A manually controlled or automatic servo system maintains a constant predetermined value of the SPV for each wavelength. A probe electrode immersed in an electrolyte solution containing redox couples (preferably quinhydrone) having an oxidation-reduction potential (E) in the order of +0.6 to −1.65 volts couples the SPV to a measurement system. The redox couple solution functions to create a liquid Schottky barrier at the surface of the material. The Schottky barrier is contacted by merely placing the probe in the solution. The redox solution is placed over and in contact with the material to be tested and light is passed through the solution to generate the SPV. To compensate for colored redox solutions a portion of the redox solution not over the material is also illuminated for determining the color compensated light intensity. Steady red light is also used as an optical bias to reduce deleterious space-charge effects that occur in amorphous silicon.

31 Claims, 4 Drawing Figures

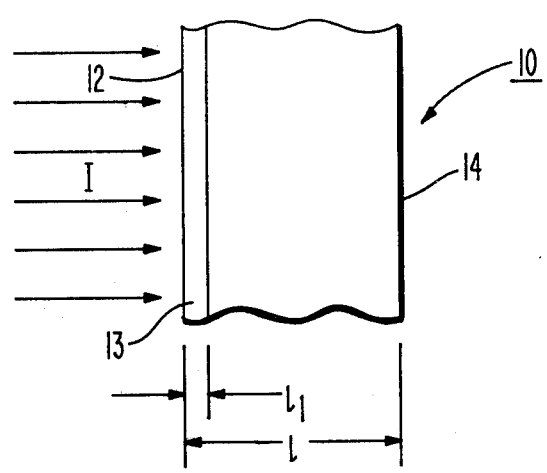
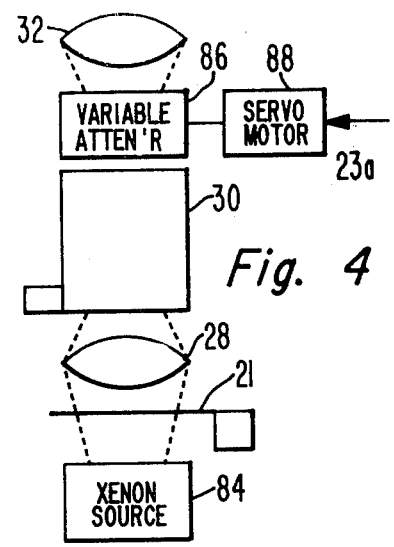
Fig. 1
Fig. 4
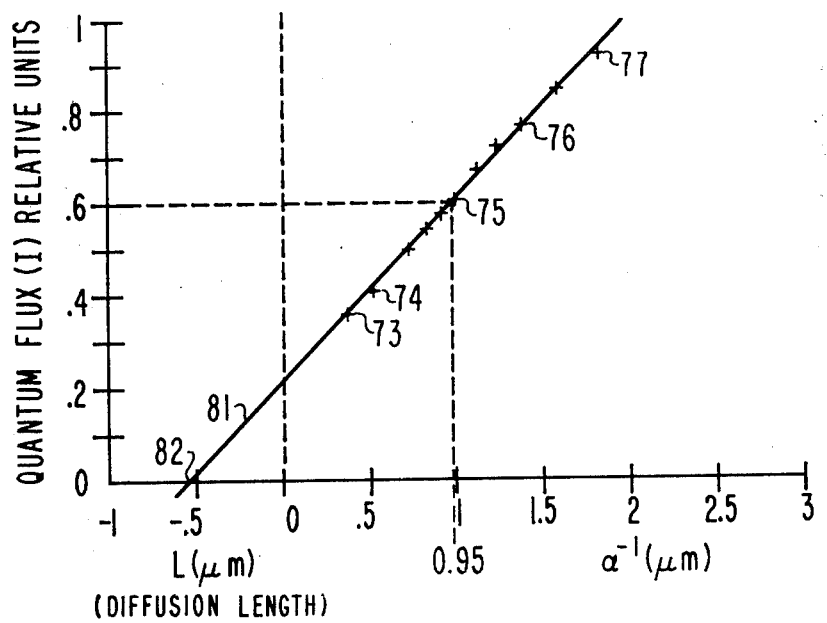
Fig. 3

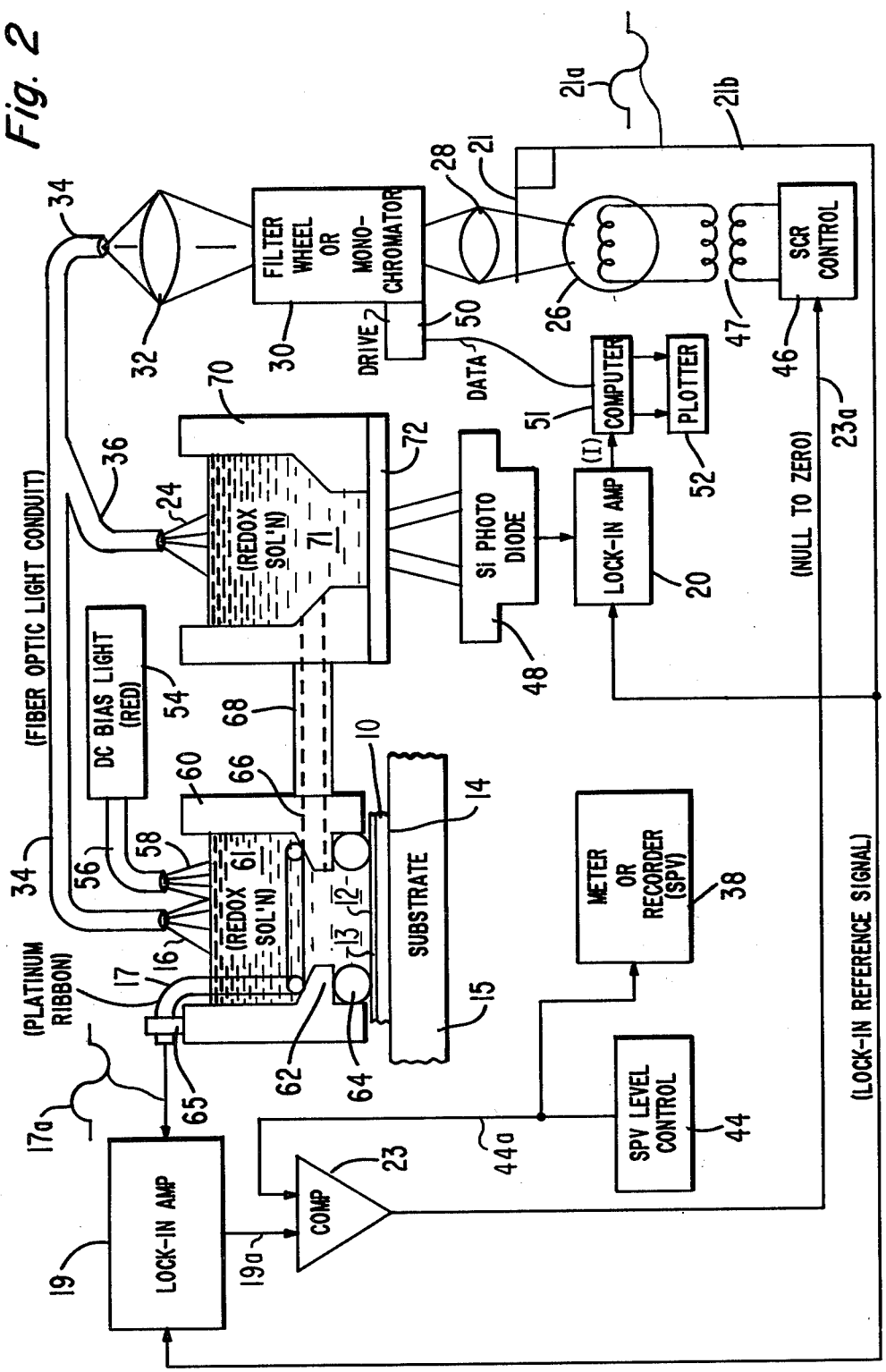

METHOD AND APPARATUS FOR DETERMINING MINORITY CARRIER DIFFUSION LENGTH IN SEMICONDUCTORS

BACKGROUND OF THE INVENTION

The Government of the United States of America has rights in this invention pursuant to Subcontract No. XG-0-9372-1 awarded by the Department of Energy.

This invention relate to an apparatus for determining the minority carrier diffusion length in semiconductors using the constant-magnitude surface photovoltage (SPV) method.

Apparatus and methods for determining the minority carrier diffusion length (L) using the SPV method are well known. In brief, the principle of the diffusion length (L) determination requires the illumination of a specimen surface with monochromatic radiation of energy slightly greater than the bandgap of the semiconductor. Electron-hole pairs are produced and diffuse to the illuminated (front) surface where they are separated by the electric field of the depletion region (i.e., the surface-space-charge region) to produce a surface photovoltage (SPV). A portion of the SPV signal is coupled to an amplifier for amplification and measurement. The photon intensity (photons per sq. cm. per second) is adjusted to produce the same magnitude of SPV at various wavelengths of illumination. The photon intensity required to produce this constant magnitude SPV signal is conveniently plotted on the ordinate against the reciprocal of the absorption coefficient on the abscissa for each wavelength. The resultant plot is linear and is extrapolated to the zero intensity intercept on the negative abscissa. This intercept value is the effective diffusion length (L). For a more detailed description of the theory and background for this method, see an article "A Method for the Measurement of Short Minority Carrier Diffusion Lengths in Semiconductors," by A. M. Goodman in the *Journal of Applied Physics*, Vol. 32, No. 12, pp. 2550-2552, December 1961. The American Society for Testing and Materials has adopted a standard using this method which is published as ASTM F 291-78. The ASTM standard, when implemented according to the block diagram of FIG. 1 of ASTM F 291-78, is provided particularly for testing the diffusion length (L) for minority carriers in silicon but the method in general may be used for other semiconductor materials.

See U.S. patent application, entitled "METHOD AND APPARATUS FOR DETERMINING MINORITY CARRIER DIFFUSION LENGTH IN SEMICONDUCTORS" Ser. No. 153,920, filed on May 28, 1980 by A. M. Goodman now U.S. Pat. No. 4,333,051, issued June 1, 1982, for a description of an apparatus using this principle in which a servo system maintains a constant predetermined value of the SPV to minimize the effects of drift caused by slowly diffusing minority carriers during a test. Moreover, this Goodman application describes a capacitance-pickup electrode which is placed to make physical contact with the surface of a semiconductor material to sense SPV test signals. The SPV method uses a surface junction to effect what may be termed "band-bending" to collect minority carriers generated at various depths by monochromatic light of varying absorption coefficient. In such SPV methods, as described in the Goodman patent application, the exciting light is chopped or modulated in order to develop a.c. components of the SPV pickup or detection by a capacitance pickup or probe. The Goodman method however is not suitable for measuring the significantly small diffusion length of amorphous silicon which is known to exhibit very slow transients in SPV generated by chopped or modulated light.

Another conventional method for measuring the minority carrier diffusion length (L) of semiconductor material involves measuring a certain distance on the semiconductor which distance is on the order of the length L. See J. N. Shive, "Properties, Physics and Design of Semiconductor Devices," Van Nostrand, N.Y. 1959, p. 337, for a description of this method. This measurement is very difficult to use for amorphous silicon because L is about or less than a few thousand angstroms, i.e. 0.2-0.3 $\mu$m.

See U.S. patent application, entitled "METHOD AND APPARATUS FOR DETERMINING MINORITY CARRIER DIFFUSION LENGTH IN SEMICONDUCTORS," Ser. No. 228,575, filed on Jan. 26, 1981 by B. Goldstein et al., now U.S. Pat. No. 4,393,348, issued July 12, 1983, for a description of an apparatus by which the SPV is measured by a Kelvin method-type probe. A d.c. light source illuminates the surface of the semiconductor material, while the probe is vibrated to provide an a.c. SPV signal. However, the electrical signals for the Kelvin-probe are quite small. Moreover, shielding is usually required to avoid interfering electrical ambient noise. Furthermore, the sample under test and the Kelvin-probe are typically required to be mounted in a completely shielded vacuum system.

In view of these conditions, there is a need for a means to determine the SPV in semiconductors by a direct connection to the surface of the material using steady or very low frequency varying light.

SUMMARY OF THE INVENTION

According to the present invention, the diffusion length (L) of minority carriers of semiconductor material, for example, amorphous silicon, is determined by illuminating the surface with a steady or nearly steady light and measuring the surface potential (SPV) with a contact coupled to the surface through a redox (reduction-oxidation) solution establishing a liquid Schottky barrier.

BRIEF DESCRIPTION OF THE DRAWING

In the drawing:

FIG. 1 is a schematic illustrating the geometric parameters of a semiconductor specimen useful in understanding and practicing the invention;

FIG. 2 is a block schematic of the preferred form of apparatus useful in practicing the invention;

FIG. 3 is a plot of the quantum flux I versus the reciprocal of the absorption coefficient; and FIG. 4 is a modification of the apparatus of FIG. 2 illustrating another embodiment of the invention.

DETAILED DESCRIPTION OF A PREFERRED EMBODIMENT

The measuring apparatus of the invention as illustrated in FIG. 2, to be described, provides a means using a modified version of the constant-magnitude surface photovoltage (SPV) method for determining the minority carrier diffusion length (L) in a semiconductor formed of the type that will be defined. In the embodiment to be described, the wafer for which the diffusion length is to be measured is a layer of hydrogenated amorphous silicon (αSi:H). Nevertheless, the invention, it is to be understood, can be used to determine the diffusion length of minority carriers in semiconductor materials other than those in which the diffusion length is significantly small, provided the thickness of the semiconductor material wafer being tested is at least greater than the diffusion length of the minority carrier and preferably four times that diffusion length. Such semiconductor material includes, but is not necessarily limited to, silicon, germanium, gallium arsenide, indium phosphide as well as amorphous semiconductor material.

The geometry of a specimen wafer 10 is illustrated in FIG. 1. Wafer 10 is assumed to be in the form of a semiconductor slab having a thickness l formed in the embodiments to be described of hydrogenated amorphous silicon. One surface 12 is uniformly illuminated by monochromatic light from a source of photon energy hν, slightly greater than the band gap ($E_G$) of the semiconductor material, while the opposite surface 14 is kept dark. The quantum of flux of the light is represented by I in relative units. Electron hole pairs are produced by the absorbed photons. Some of these pair diffuse to the illuminated surface 12 where they are separated by the electric field of the depletion or surface-space-charge region 13 having a thickness $l_1$, producing a surface photovoltage (SPV).

The apparatus for carrying out the measurements necessary to determine the diffusion length (L) according to the present invention is shown in FIG. 2. The apparatus provides a means to measure the surface photovoltage of the semiconductor. As described in detail in the aforementioned Goodman et al. patent, the surface photovoltage (i.e., SPV) developed at the illuminated surface 12 of the amorphous silicon film of the wafer 10 is a function of the excess minority carrier density injected into the surface space charge region 13 (as shown and described above for FIG. 1). The density is in turn dependent upon the incident light intensity (photo flux) I, the optical absorption coefficient and the diffusion length L. The diffusion length may be measured by determining the variation of I with α (i.e., with wavelength λ at a constant value of SPV). An accurate knowledge of α as a function of wavelength λ is thus required. An example of a graph that is used to plot several measurements of the SPV at various wavelengths is illustrated in FIG. 3 to be described further hereinafter. The thickness of the material l as illustrated in FIG. 1 must be greater than the diffusion length L. In practice, a material thickness (l) of at least four times the diffusion length (L) is preferred although the invention provides practical measurements for material of thicknesses between two and four times L.

The optical subsystem of the apparatus of the invention is formed of a light source 26 for providing a spectrum of light that will include at least the desired wavelengths that are to be used for the determination of the diffusion length (L) by measuring the intensity of illumination incident upon the sample, for example, wafer 10. The measured intensity of illumination is used to determine the diffusion length (L) by the known relationship of the reciprocal of the absorption coefficient ($\alpha^{-1}$) as shown in the plot of FIG. 3.

The light source of lamp 26 provides a beam of white light which is periodically interrupted by a light chopper 21 at one frequency typically within the range of as low as 1 Hz and as high as 1,000 Hz but typically no higher than 10 Hz and applied to a filter wheel or monochromator 30 through a first lens 28. The monochromator 26 is provided with suitable means for changing the wavelength to anyone of a preselected set of wavelengths as by a wavelength drive 50. The wavelength drive 50 has means to rotate diffraction gratings and the like provided in such filter wheels or monochromators in incremental steps to change the wavelength.

The chopped beam from the monochromator 30 is passed through a focusing lens 32 which is arranged to pass the light through a fiber optic-light conduit 34 to carry the light to the sample surface via a light beam 16. Light beam 16 is passed through an oxidation reduction solution 61 (commonly called redox solution) to be described in greater detail hereinafter, contained in a liquid container 60, having an open end through which the beam 16 is passed and a lower opening adjacent the bottom inner wall of the container 60. A shoulder 62 retains a resilient O-ring 64 suitably formed of neoprene rubber of diameter sufficient to extend beyond the bottom of the container 60. With a force not shown of sufficient magnitude the O-ring 64 is compressed against the surface 12 of the sample to prevent the liquid redox solution 61 from leaking outwardly from the area of the surface that is exposed to the solution. A metallic electrode 17, suitably formed of platinum ribbon, extends from the solution through a support 65, to conduct the signal developed in the solution in response to light beam 16 to a lock-in amplifier 19.

Amplifier 19 must have a high impedance input greater than one megohm, suitably 10 megohms, in order to minimize current flow through the redox solution 61. It should be understood that excessive current flow through the redox solution may cause chemical dissolution or oxide formation of the semiconductor material.

The electrode 17 may be simply a ribbon extending into the solution. However, it is preferred that the ribbon electrode 17 be formed in a loop about the lower opening of the container 16 facing the sample surface 12. Lock-in amplifier 19 in this embodiment serves to amplify the a.c. signal 17a derived from the electrode 17 and apply it to input comparator 23. The other input of the comparator 23 is a reference voltage representing the predetermined surface photovoltage level at which the illumination intensity (I) is to be maintained constant in order to make the determination of the diffusion length L. The lock-in amplifier 19 is synchronized to the reference frequency of the chopped light. This reference signal at the frequency of the chopper represented by waveform 21a is carried from the chopper 21 via bus 21b to the optional input to the lock-in amplifier 19. As will be explained, the amplifier 19 may be a dc amplifier when the system uses continuous, uninterrupted light from source 26, for which a reference signal is not required.

For convenience, a meter 38 is connected to the output of the SPV level 44 as a reference of the voltage desired to maintain the SPV constant. The output of comparator 23 is coupled to silicon controlled rectifier (SCR) control 46. SCR control 46 maintains the voltage at a transformer 47 to a constant value when the input on path 23a is zero. The lamp 26 is energized via the transformer 47 at thus a predetermined voltage. The comparator 23, when the input from control 44 and the lock-in amplifier 19 are equal, provides the zero voltage 23a to control the SCR control 46.

Chopper 21 is operated to interrupt the light 26 at a rate of about preferably 1–5 cycles/second for use with amorphorous silicon. In a continuous or d.c. light mode, the chopper is not operated; it is just positioned to allow the light to pass from the lamp 26 to the filter wheel 30 via the lens 28.

The SCR control 46 is suitably adjusted to a desired reference level with means not shown to bring the illumination intensity (I) into the range of intensity within which the SPV may be set by the level control 44 and the comparator 23 at each selected wavelength of light illuminating the surface.

The redox couple solution 61 is an oxidation reduction solution in an electrolyte that has been discovered to form a liquid Schottky barrier at the surface of the semiconductor material in which it is in contact. This phenomenon is described in an article entitled "Schottky Barriers at the Interface Between Amorphous Silicon and Electrolytes" by Richard Williams, *J. Applied Physics*, 50 (Apr. 4, 1979), pp. 2848–2851. I have in the performance of the measuring technique of the present invention used several of the redox solutions identified in the Williams paper. In addition, I have found that a solution of hydroquinone/quinone, commonly known as quinhydrone, a solution also used in pH testing, provides a good result. The various solutions that I have tried are tabulated below.

TABLE 1

| Ion Concentrations of Redox Couple (mol/L) | E (Volt) | Other Components of Solution (mol/L) |
|---|---|---|
| Stannous/Stannic $Sn^{+2}$ (0.1)/$Sn^{+4}$ (0.1) | −0.15 | $H_2SO_4$ (0.75) |
| Ferrocyanide/Ferricyanide $Fe(CN)_6^{-4}$ (0.1)/$Fe(CN)_6^{-3}$ (0.1) | −0.36 | $H_2SO_4$ (0.5) |
| Ferrous/Ferric $Fe^{+2}$ (0.05)/$Fe^{+3}$ (0.05) | −0.77 | $H_2SO_4$ (0.75) |
| Ceraus/Ceric $Ce^{+3}$ (0.05)/$Ce^{+4}$ (0.05) | −1.61 | $H_2SO_4$ (0.75) |
| Hydroquinone/Quinone $C_6H_4(OH)_2/C_6H_4O_2$ (equimolar) | −.70 (See Note) | Standard Buffered pH6 Solution |

Note: for the quinhydrone couple the electrode potential (E) is a function of the pH of the solution according to the well-known relation $E = -0.70 + (0.059)(pH)$. In the solution of table I where pH is 6, E = 0.35.

While there are many known redox couples, I have not examined all of them for use in the present invention. From the experience of the solutions used so far it seems that the range of electrode potentials (E) of useful redox couples are in the order of +0.1 to −1.65 volts for use with undoped or slightly doped n-type material. For p-type, αSi redox solution of electrode potentials of +0.6 volt to +0.1 appear to be suitable. Moreover, it is essential that both of the components of the redox couple be soluble, be stable and be nonreactive to the material of the semiconductor surface. Futhermore, the redox solution should be relatively easy to use in the sense that it has no gaseous or solid products.

In general, the redox solution is selected to meet the criteria just outlined. Thus, a redox acid solution in the range of +0.6 to −1.65 (depending also on whether the semiconductor is p-type or n-type) appears to be useful in practicing the invention. The basic redox solutions would appear to form oxides. Nevertheless, I have not tried a basic redox solution in practicing this invention. See W. M. Latimer's text on *Oxidation Potentials*, Prentice Hall, 1952, table 84, pp. 340–345, for a comprehensive list of available redox solutions. Solutions in that table not useful for this invention will be apparent to those skilled in the art in view of the criteria just described.

While the liquid Schottky barrier that is provided by this redox solution 61 is very effective in coupling the SPV from the surface 12 to the measuring circuit via the electrode 17, as well as providing a system that is substantially noise free down even to a few hundred microvolts of signal, the problem in measuring very accurately the diffusion length L is that the known liquids are usually colored. Thus, the sample of the surface material 12 must be illuminated through a colored redox couple solution 61. This colored liquid introduces an error in the photon flux measurement. This problem is overcome by providing a compensating optical beam that balances out the colored light effected by the colored solution. This compensation is accomplished by the apparatus of the redox solution 71 in a container 70.

The preferred embodiment uses a colored solution compensation in which solution 61 is about 5 mm deep. If a very thin layer of the redox solution 61, i.e. a solution about 0.1 mm, were used, color compensation would not be needed. A suitable electrode for such a thin redox layer would be in transparent planar form.

The liquid 71 in container 70 is exposed to the light from lamp 26 via the light conduit 34 and thence through a conduit 36 of equal optical conductivity as the light optic conduit 34. Accordingly, the light beam 24 illuminating the redox solution 71 is of the same spectral distribution as light beam 16. Note that the respective intensities of the beams 16 and 24 need not be the same. The redox solution 71 is provided by means of a tube 68 connected to the container 60 via a passageway 66. The liquid of solution 61 is thus coupled via the tube 68 into the container 70. The bottom portion of the container 70 is open with the same size aperture as that of container 60 and is sealed from leakage by means of a transparent closure plate 72, such as glass. Light passing through the solution 71 is detected by a photodetector 48 providing an a.c. signal to lock-in amplifier 20. The lock-in amplifier is synchronized by the light chopper signal 21(a) via the path 21(b). If the system is a continuous, noninterrupted light illuminated system, lock-in amplifier 20 will be a d.c. amplifier without synchronization from the chopper. With the color compensating redox couple solution 71, the errors introduced by the identical color of solution 61 are eliminated.

It should be understood as indicated above that if the redox solution 61 does not provide any significant absorption as is introduced by a colored solution, the compensating redox solution 71 is not needed. Accordingly, the illumination flux detected by a silicon photodiode 48 is merely oriented to receive light from the light beam 24 directly.

If the diffusion length L is sufficiently small, as in α Si, so that it is no longer large compared to the space charge region 13 in semiconductor material 10, the accuracy of the measurement may be impaired. I have discovered that such operating conditions can be overcome by providing a d.c. bias light (54) in parallel with the illuminating light (26). This is achieved by preferably a red d.c. bias light as indicated by 54 coupled by means of a light conduit 56 to provide a red light beam 58 that is known to penetrate through the space charge region 13. I have discovered that the red bias light 54 provides a means to suppress the space charge region effects mentioned above. Accordingly, the accuracy of the determination of the diffusion length L is achieved.

For each exposure of the material of the semiconductor 10 to light at a different wavelength, a wavelength drive 50 is provided to operate a filter wheel or monochromator 30 to a selected wavelength. The wavelength drive 50 provides also an input signal to a computer 51 which responds also to the output of lock-in amplifier 20 providing an intensity illumination signal (I). The data signals of the illumination intensity (I) and wavelength are calculated by the computer 51 to provide control signals to operate a plotter 52 to plot the various measurements as along a plot as indicated in FIG. 3.

In the practice of the invention it should be understood that the intensity of light source 26 should be sufficient to develop a light beam 16 that will develop an appreciable SPV on the surface 12 and yet not be so great as to saturate the bending of the energy bands. For amorphous silicon, band bending saturation occurs for SPV values at about 300 millivolts.

Suitable calibration of the flux reading (I) generated by the lock-in amplifier 20 is needed to compensate for the wavelength dependent response of the detector 48 for each different wavelength of light source 26 used for the measurements. For amorphous silicon, the light is varied within a range of 4000 to 7000 Angstroms. In practicing the present invention in the laboratory, the wavelength compensation is done by calculation. In practical applications the computer calculates the value needed.

As explained in greater detail in the above identified patent of A. M. Goodman, the value of the surface photovoltage (SPV) is used to determine the diffusion length L at a given wavelength of light.

The magnitude of the SPV depends on both the optical absorption coefficient $\alpha$ (cm$^{-1}$) and the photon flux I (photons —cm$^{-2}$—sec$^{-1}$). A series of different wavelength ($\lambda$) values is selected to give different values of the absorption coefficient. At each value of the wavelength $\lambda$, the flux I is adjusted to give the same value of the SPV, that is, a constant magnitude of the SPV. If I is plotted against the reciprocal of the absorption coefficient ($\alpha^{-1}$) for each of these constant magnitude SPV points, the result is a linear graph whose extrapolated intercept on the negative reciprocal absorption coefficient axis is the effective diffusion length (L). An example of such a graph is illustrated in FIG. 3 to be described further hereinafter. The thickness l of the material 10 must be much greater than the diffusion length L. In practice, a material thickness (l) of at least four times the diffusion length (L) is preferred although the invention provides practical measurements for material of thicknesses between two and four times L.

In the operation of the apparatus illustrated in FIG. 2, light from source 26 at a first predetermined wavelength as set by the $\lambda$ drive 50 illuminates a surface 12 via light conduit 34. The chopper 21 is operated for example at a frequency of three cycles per second. The light is thereby chopped to provide an alternating signal 17a derived from the SPV developed by the illuminating light beam 16. The signal 17a is coupled to the lock-in amplifier 19 which is synchronized by the chopper frequency signal 21a. The amplified signal from amplifier 19 is coupled to comparator 23 to compare that signal to the reference signal from SPV level control 44 which is adjusted to a predetermined SPV value as indicated on meter 38. The signal on path 19a to comparator 23 is a d.c. signal representing the RMS value of the SPV. When that value is equal to the predetermined value of path 44a the output from comparator 23 is zero. The signal on path 23a adjusts the SCR control 46 to maintain the predetermined, preset value.

A series of tests at different wavelength of light source 26 are performed in a similar manner. Thus, a second wavelength is selected for light source 26 via the monochromator 30 to illuminate the surface 12. The circuit operates in a similar manner to provide a reading on meter 38 indicative of the SPV. The light intensity of the light beam 24, is measured after passing through solution 71 by the photodiode 48. The signal from the diode 48 after amplification by amplifier 20 provides an output signal I representing the illumination intensity or quantum flux. Accordingly, for the series of tests to meet the requirement of a constant SPV, the intensity of the light source 26 for each wavelength is automatically adjusted so that the SPV value of the first measurement at the first selected wavelength is the same for all tests.

A series of such illumination steps at different wavelengths are repeated to provide a fair number of sample points of the type indicated by points 73, 74, 75, 76, and 77 illustrated in FIG. 3. Each sample point is referenced to FIG. 3 by the quantum flux (I) in relative units needed to develop the constant SPV value. This flux value is determined by amplifier 20 providing a signal representing the sampled light detected by photodetector 48.

For each point to be plotted as illustrated by FIG. 3, the absorption coefficient $\alpha$ is determined from the respective wavelengths of light used for each test point. These points are then plotted as shown in FIG. 3. For example, for point 75 for a quantum flux I of 0.6, the reciprocal of the absorption coefficient for the wavelength of the light is approximately 0.95 cm as shown plotted in dotted lines. A plurality of such test points are plotted and a line 81 is drawn as indicated to extend into the negative axis which, as known, and explained above represents the diffusion length L in micrometers. In the example illustrated, the intersection point 82 indicates a diffusion length L equal to 0.55 micrometers for the particular specimen of amorphous silicon tested.

In practice, the invention may be used in the fabrication or manufacture of solar cell wafers. Accordingly, in such uses the redox solution probe can be housed in the same chamber as the processing apparatus. Moreover, the invention can be used to couple the SPV voltage for using a steady source of light. For such use the chopper 21 will be rendered inoperative to allow a steady illumination. Accordingly, the lock-in amplifiers 19 and 20 will be d.c. amplifiers. Otherwise, the system will operate in the same manner as described hereinabove.

Instead of controlling the intensity of the light beams 16 and 24 by the control of the intensity of incandescent lamp 26, the same effect can be achieved with a constant intensity lamp by inserting a variable transmission light attenuator 86 into the light path between monochromator 30 and lens 32 as shown in FIG. 4. This attenuator is driven by a servo motor 88 operating in response to an error signal from the comparator via path 23a. This arrangement allows the use of a more powerful xenon lamp 84 even though such lamps are not well adapted to direct electrical control of their intensity. The operation of the system of FIG. 4 is otherwise the same as described above for FIG. 2. The use of the xenon light source 84 produces higher light intensity resulting in a better signal-to-noise ratio thereby allowing for more sensitive SPV measurements.

It will now be appreciated that the invention provides an apparatus and method for determining the diffusion length L of minority carriers in semiconductor material having significantly small diffusion lengths. Such material is typically amorphous silicon including hydrogenated amorphous silicon of the type used in the fabrication of solar photovoltaic devices. The use of an electrolyte solution which develops a liquid Schottky barrier at the surface of the material according to the invention allows for essentially a direct current coupling of the SPV from the material to external circuitry for measurement. The illuminating light can be steady or chopped, the only limitation of the illumination characteristic being the time response characteristics of the material to light.

While there is physical contact made to the surface of the material by the solution and the seal of the container, proper care in positioning the container on the material surface and the proper selection of the solution makes the procedure substantially non-destructive.

It should now be appreciated and understood that the Schottky barrier developed by the redox couple solution acts precisely like a surface photovoltage generator in the sense as understood in the prior art. The discussion of the prior art phenomenon is described quite clearly in the above-identified A. M. Goodman patent application.

The liquid Schottky barrier according to this invention operates to quite low chopping rates in the order of 1–5 cycles/second. Moreover, the liquid Schottky barrier allows for steady light illumination whereby the system operates in essentially a direct current mode. Accordingly, since no capacitive coupling is required as has heretofore been required in prior art systems, the coupling of the SPV to the electronic amplifiers is entirely conductive. Furthermore, the output signals derived from the terminal in the liquid solution are relatively large for a given amount of light illumination provided the oxidation reduction potential of the selected redox coupling solution results in a high Schottky barrier height and high open circuit voltage both on the order of 300 millivolts.

Various modifications can be made to the embodiments described as will be apparent to those skilled in the art. Thus, the measurement and control means can be utilized with open or closed loop servos of the type disclosed in the aforementioned patent applications of A. M. Goodman and B. Goldstein et al.

While the invention is advantageously useful in determining the diffusion length of the minority carriers of amorphous silicon because such lengths are so small and, moreover, because the response time is so large, the invention is useful in general for determining the minority carrier length of any semiconductor material regardless of the magnitude of the diffusion length or the response time. The choice of whether to use the so-called chopped light technique described in the aforementioned patent application of A. M. Goodman, the technique disclosed in the Goldstein et. al. application (which may be termed the d.c. light technique) for the technique according to the present invention disclosed hereinabove (which may be termed the "direct connection" technique) depends on the conditions under which the tests are to be made.

What is claimed is:

1. A method for determining the minority carrier diffusion length of a sample of semiconductor material, the sample having two major surfaces, one of the surfaces arranged for illumination and the other surface shielded from illumination including the steps of:
   (a) covering a portion of the one major surface of the sample with an electrolyte solution containing redox couples having redox (oxidation-reduction) potential in the range of +0.6 to −1.65 volts, said electrolyte solution being soluble, stable and non-reactive to the semiconductor material and free of solid or gaseous products and forming a liquid Schottky barrier at said surface portion;
   (b) illuminating a portion of the one major surface of the sample with monochromatic light that is of a selected wavelength by passing said light through said redox couple solution;
   (c) providing an electrical signal representing the surface photovoltage (SPV) on the sample generated in response to said light;
   (d) controlling the SPV electrical signal to a predetermined value; and
   (e) providing a first electrical signal representing the illuminating intensity (I) incident upon the sample, and a second electrical signal representing the wavelength of the light.

2. The method of claim 1 wherein said material is amorphous silicon and the light is at a wavelength within the range of 4,000 to 7,000 angstroms.

3. The method of claim 2 wherein the redox couple solution comprises a stannous/stannic ($Sn^{+2}/Sn^{+4}$) couple in an acid solution in which the standard electrode potential E is −0.15 volts.

4. The method of claim 2 wherein the redox couple solution comprises a ferrocyanide/ferricyanide [$Fe(CN)_6^{-3}/Fe(CN)_6^{-4}$] couple in an acid solution in which the standard electrode potential (E) is −0.36 volts.

5. The method of claim 2 wherein the redox couple solution comprises a ferrous/ferric ($Fe^{+2}/Fe^{+3}$) couple in an acid solution in which the standard electrode potential (E) is −0.77 volts.

6. The method of claim 2 wherein the redox couple solution comprises a cerous/ceric ($Ce^{+3}/Ce^{+4}$) couple in an acid solution in which the electrical potential (E) is −1.61 volts.

7. The method of claim 2 wherein the redox couple solution comprises a hydroquinone/quinone couple [$C_6H_4(OH)_2/C_6H_4O_2$] in standard buffered solution in which the electrical potential (E) is about $-0.7 + 0.059 \times pH$.

8. The method of claim 1 wherein said SPV electrical signal is provided by a metallic electrode inserted in said solution conducting therefrom electrical signals generated in said redox couple solution.

9. The method of claim 1 further comprising the steps of:
   (a) passing light through a second solution consisting of said electrolyte and said redox couples to a photodetector,
   (b) generating, in response to detected light, said first electrical signal (I) whereby the effects on the SPV signal due to light absorption through the solution covering said sample portion is compensated so that the value of the SPV signal is independent of the light absorption effects of the sample-covering solution.

10. The method of claim 1 further comprising the step of illuminating said one major surface with steady red light to suppress space charge effects in said sample.

11. The method of claim 1 comprising the step of automatically plotting a curve of illuminating intensity (I) versus the reciprocal absorption coefficient ($\alpha$) as a function of wavelength ($\lambda$) for a plurality of wavelengths of light.

12. The method of claim 1 comprising illuminating the sample with steady monochromatic light.

13. The method of claim 1 comprising illuminating the sample with chopped monochromatic light.

14. An apparatus for determining the minority carrier diffusion length of a sample of semiconductor material, the sample having two major surfaces, one of the surfaces arranged for illumination and the other surface shielded from illumination comprising:
   (a) means for supporting over a portion of the one major surface an electrolyte solution containing redox couples having a redox (oxidation-reduction) potential in the range of +0.6 to −1.65 volts, said electrolyte solution being soluble, stable, and non-reactive to the semiconductor material and free of solid or gaseous products and forming a liquid Schottky barrier at said surface portion;
   (b) means for illuminating a portion of the one major surface of the sample with monochromatic light that is of a selected wavelength by passing said light through said redox couple solution;
   (c) means for providing an electrical signal representing the surface photovoltage (SPV) on the sample generated in response to said light;
   (d) means for controlling the SPV electrical signal to a predetermined value; and
   (e) means for providing a first electrical signal representing the illuminating intensity (I) incident upon the sample, and a second electrical signal representing the wavelength of the light.

15. The apparatus according to claim 14 wherein said semiconductor material is amorphous silicon and wherein said light has a wavelength within the range of 4000 to 7000 angstroms.

16. The apparatus according to claim 15 wherein the redox couple solution comprises a stannous/stannic ($Sn^{+2}/Sn^{+4}$) couple in an acid solution in which the electrical potential (E) is −0.15 volts.

17. The apparatus according to claim 15 wherein the redox couple solution comprises a ferrocyanide/ferricyanide [$Fe(CN)_6^{-4}Fe(CN)_6^{-3}$] couple in an acid solution in which the electrical potential (E) is −0.36 volts.

18. The apparatus according to claim 15 wherein the redox couple solution comprises a ferrous/ferric ($Fe^{+2}/Fe^{+3}$) couple in an acid solution in which the electrical potential (E) is −0.77 volts.

19. The apparatus according to claim 15 wherein the redox couple solution comprises a cerous/ceric ($Ce^{+3}/Ce^{+4}$) couple in an acid solution in which the electrical potential (E) is −1.61 volts.

20. The apparatus according to claim 15 wherein the redox couple solution comprises a hydraquinone/quinone couple ($C_6H_4(OH)_2/C_6H_4O_2$) couple in an acid solution in which the electrical potential (E) is about $-0.7 + 0.059 \times pH$.

21. The apparatus of claim 14 wherein said electrolyte support means comprises:
   (a) a hollow member having a relatively large upper opening and a relatively small bottom opening, the size of said smaller opening defining the sample portion to be illuminated, said member being positioned over said sample, and
   (b) means for containing said solution within said member and covering only said sample portion surface.

22. The apparatus of claim 21 wherein said lower opening is circular and a resilient o-ring is retained in position between said member and said sample surface by a downward force to prevent leakage of said solution.

23. The apparatus of claim 22 further including:
   (a) a second electrolyte support means comprising:
   (a1) a hollow member having an upper and lower opening of the same respective dimensions as said first-mentioned, hollow-member support means,
   (a2) a transparent sealing closure plate over said lower opening to retain said solution in said second member, and further comprising
   (b) conduit means between said first and second hollow member to allow said solution to flow freely between the respective hollow members
   (c) said first and second hollow members being spatially positioned so that the closure plate is at the same elevation as said sample,
   (d) photodetector means positioned beneath said closure to receive light passing through redox couple solution in said second hollow member,
   (e) means for illuminating said redox couple solution through the upper opening of said second member with light from the same source of light illuminating said sample, and
   (f) the electrical signal generated by said photodetector means being the first electrical signal representing the illuminating intensity (I) incident upon the sample and being compensated for absorption effects due to the redox couple solution in said first hollow member.

24. The apparatus according to claim 14 further including a means for illuminating said major one surface portion with steady red light to suppress space charge effects in said sample.

25. The apparatus according to claim 14 further including plotting means responsive to said first and second signals for automatic plotting.

26. The apparatus according to claim 15 wherein said sample is formed of N-type amorphous silicon semiconductor material and wherein said redox solution has a redox potential of +0.1 to −1.65 volts.

27. The apparatus according to claim 14 wherein said sample is formed of P-type amorphous silicon semiconductor material and wherein said redox solution has a redox potential of +0.6 to +0.1 volts.

28. The apparatus according to claim 14 wherein said electrical signal means includes a high impedance amplifier to reduce the current drawn through said solution.

29. The apparatus according to claim 14 wherein said illuminating means includes a xenon light source.

30. The apparatus according to claim 29 further including variably adjustable attenuator means to attenuate light intensity from said xenon light source.

31. The apparatus according to claim 30 further including servo means responsive to said SPV signal to automatically adjust said attenuator to control the light intensity from said xenon light source to a predetermined value.

* * * * *